(12) United States Patent
Eriksson et al.

(10) Patent No.: US 8,665,917 B2
(45) Date of Patent: Mar. 4, 2014

(54) METHOD FOR CALIBRATING A TUNABLE LASER

(75) Inventors: Urban Eriksson, Bromma (SE); Robert Lewén, Tyresö (SE); Jan-Olof Wesström, Stockholm (SE); Filip Öhman, Örsundsbro (SE)

(73) Assignee: Syntune AB, Kista (SE)

( * ) Notice: Subject to any disclaimer, the term of this patent is extended or adjusted under 35 U.S.C. 154(b) by 0 days.

(21) Appl. No.: 13/877,479

(22) PCT Filed: Oct. 5, 2011

(86) PCT No.: PCT/SE2011/051190
§ 371 (c)(1),
(2), (4) Date: May 30, 2013

(87) PCT Pub. No.: WO2012/047169
PCT Pub. Date: Apr. 12, 2012

(65) Prior Publication Data
US 2013/0243015 A1  Sep. 19, 2013

(30) Foreign Application Priority Data
Oct. 6, 2010 (SE) ...................................... 1051045

(51) Int. Cl.
*H01S 3/10* (2006.01)
*H01S 3/00* (2006.01)
(52) U.S. Cl.
USPC .......................................... 372/20; 372/38.02
(58) Field of Classification Search
USPC ........................................... 372/20, 34, 38.02
See application file for complete search history.

(56) References Cited

U.S. PATENT DOCUMENTS

| | | | |
|---|---|---|---|
| 6,504,856 B1 | 1/2003 | Broberg et al. | |
| 6,658,033 B1 | 12/2003 | Andersson | |
| 6,807,204 B1 | 10/2004 | O'Dowd | |
| 7,483,453 B2 | 1/2009 | Diffily et al. | |
| 2007/0258494 A1 | 11/2007 | Davies et al. | |

FOREIGN PATENT DOCUMENTS

| | | |
|---|---|---|
| EP | 1 432 087 | 6/2004 |
| WO | 03077382 | 9/2003 |
| WO | 2005112209 | 11/2005 |
| WO | 2009116947 | 9/2009 |

OTHER PUBLICATIONS

International Search Report dated Jan. 12, 2012, corresponding to PCT/SE2011/051190.

*Primary Examiner* — Armando Rodriguez
(74) *Attorney, Agent, or Firm* — Young & Thompson

(57) ABSTRACT

Method for calibrating a tunable semiconductor laser having a phase section and a first Bragg reflector section, through which sections a phase current and a first reflector current, respectively, is applied, includes: a) selecting a phase current; b) identifying a range of reflector currents that achieves emission of light from the laser within a desired frequency band; c) scanning the reflector current(s) over the range of reflector currents, for each of at least two different phase currents, and reading the relative output power of the laser for each point scanned; d) identifying one stable operating point; e) identifying and storing one stable, continuous tuning line as constructed by interpolating; f) calibrating the laser frequency and observing a fed back signal from a target for the light emitted from the laser; g) measuring the temperature of the laser; and h) storing temperature and one operating point along the tuning line.

16 Claims, 8 Drawing Sheets

METHOD FOR CALIBRATING A TUNABLE LASER

The present invention relates to a method for calibrating and tuning a tunable semiconductor laser, more precisely a tunable laser of the type DBR, MGY-DBR, SG-DBR, SSG-DBR, DS-DBR or the like, comprising at least a phase section and at least one or two Bragg reflector sections to which different currents are applied. The laser is tuned by selecting certain combinations of such currents.

In high-speed optical data communication networks, such tunable lasers are used for sending optical data signals from one end of a communication network, to be detected at another end of the network. In order to efficiently transmit data, it is vital that the laser is calibrated properly, so that the light emitted can be detected at the receiving end. Such calibration involves finding optimal operating points, associated with stable, powerful light emission and high side-mode suppression. In systems using wavelength division multiplexing this also involves tuning the laser to such optimal operating points at which the light emitted additionally is within the acceptable detection frequency range.

U.S. Pat. No. 6,658,033 discloses a method for finding hysteresis free operating points in DBR-type tunable lasers. U.S. Pat. No. 6,504,856 discloses a method for finding hysteresis free operating points within a mode plane of a laser by detecting discontinuities occurring in mode jumps. U.S. Pat. No. 6,807,204 discloses a hybrid integrated laser assembly including an optical filter, where there is a known relationship between a wavelength of an incident beam and the portion of the power transmitted by the filter. The assembly described can be calibrated using said filter.

A problem with these prior art devices and methods is that they require the laser to be kept at a constant and predetermined temperature. This normally implies cooling of the laser, typically using a thermo-electric cooler such as a peltier cooler. The use of a cooler in turn necessitates the cooled laser to be installed in a hermetically sealed package, to avoid harmful condensation from forming on the laser chip. Both the cooler itself and the hermetic package are expensive, making the whole laser module relatively expensive. Therefore, it would be advantageous to be able to calibrate a semiconductor laser without having to cool it, and then to be able to tune the laser during operation without having to keep it at a predetermined, constant temperature during operation.

Furthermore, prior art devices and methods such as those referred to above require the presence of external laboratory equipment during calibration. In most cases, they also require an additional wavelength locker, i.e. temperature stabilized, frequency calibrated filters, for frequency locking during operation. Both wavelength lockers and laboratory calibration increase the cost of the package.

The present invention solves the above problems.

Thus, the invention relates to a method for calibrating a tunable semiconductor laser comprising at least a phase section and at least a first Bragg reflector section, through which sections a phase current and a first reflector current, respectively, is applied, which laser is not actively temperature stabilized, said method comprising the steps of a) selecting at least one phase current; b) identifying for one particular phase current, selected among the phase current or currents selected in step a), a range of reflector currents that in combination with the particular phase current achieves emission of light from the laser within a desired frequency band of operation for the laser; c) scanning the reflector current or currents over at least the range of reflector currents as identified in step b), for each of at least two different phase currents, and reading the relative output power of the laser for each point scanned; d) identifying, for each phase current as used in step c), at least one stable operating point as that or those points scanned in step c) which are located between two adjacent mode boundaries, as detected as steep shifts in the relative laser output power, and possibly for which any hysteresis is minimal; e) identifying and storing into a memory at least one stable, continuous tuning line as constructed by interpolating between neighboring stable operating points, as identified in step d), of different phase currents; f) calibrating the laser frequency by scanning along said identified tuning line and observing a fed back signal from a target for the light emitted from the laser, which signal carries information about whether the light emitted by the laser is within a certain target frequency range; g) measuring the temperature of the laser when step f) was conducted; and h) storing into the memory the temperature of the laser and at least one operating point along the tuning line indicative of the target frequency range.

In the following, the invention will be described in detail, with reference to exemplifying embodiments of the invention, and to the enclosed drawing, in which.

Figure 1:
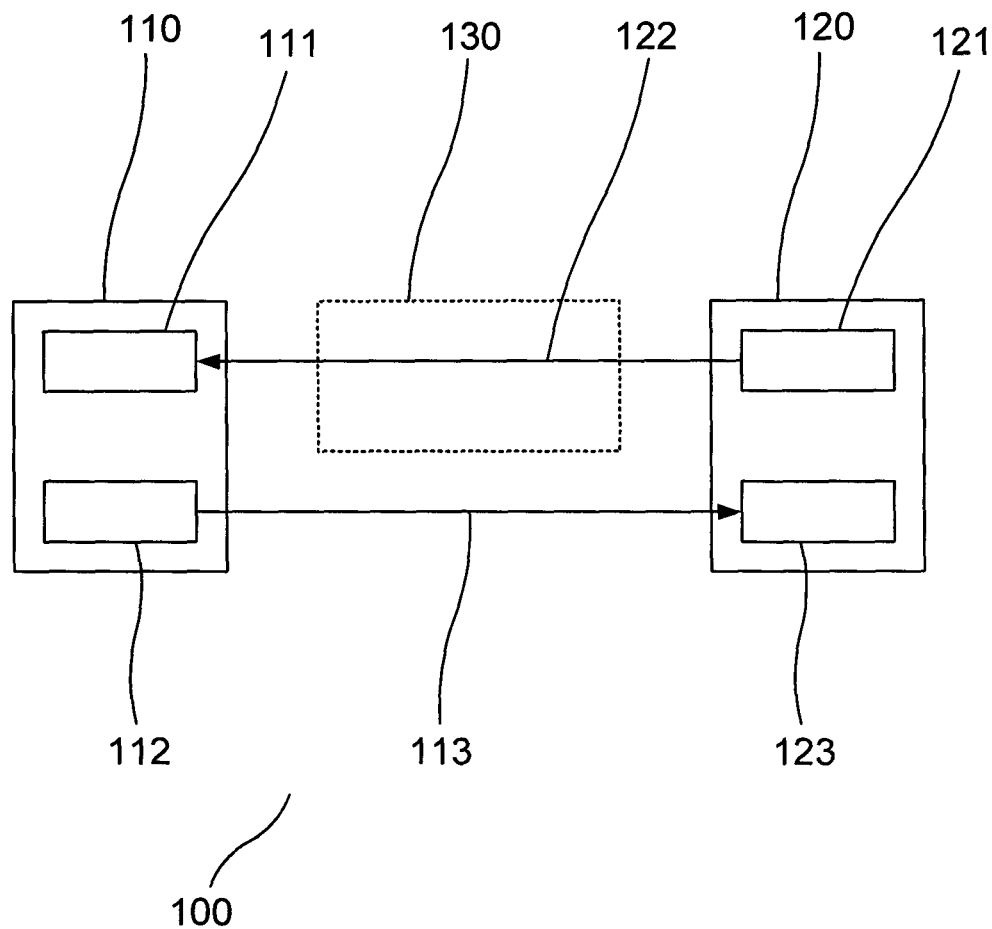
FIG. 1 is a simplified outline diagram showing an optical network in which a tunable laser is used.

FIG. 1 illustrates a receiving end 110 and a transmitting end 120 in an optical communications network 100, for example for digital communication. The network 100 could be a point to point network or part of a more complex network comprising several transmitter and receiver units. The receiving end 110 comprises an optical detector 111, arranged to read an optical signal 122, which is emitted from a tunable semiconductor laser 121 in the transmitting end 120 and sent through an optical fiber.

Between the transmitting end 120 and the receiving end 110 is an optical filter aggregate 130 arranged, comprising at least one optical frequency filter and/or frequency multiplexer. For example, the filter or filters could be part of one or several optical multiplexer/demultiplexer devices, which are standard building elements in a wavelength division multiplexed network. The filter or combination of filters will normally be associated with a certain optical frequency passband, covering wavelengths that can pass from the transmitting end 120 to the receiving end 110. For the purposes of the present invention, the filter aggregate 130 can be considered as a single optical filter with at least one certain pass-band.

According to a very preferred embodiment, the filter aggregate 130 comprises only already existing, conventional optical filters that are normal and necessary parts of the network 100. In this case, no additional filters are added to the network 100 for the specific purposes of the present invention. In general, it is necessary that the laser 121 is tuned to a frequency within the pass-band of the concatenated optical filters of the filter aggregate 130. Moreover, the light detector 111 of the receiving end 110 is preferably a conventional light detector.

The conventional light detector also preferably constitutes an already existing, conventional component of the network 100 in which the laser 121 is also a part.

As will be better understood from the following, such arrangement will make it possible to inexpensively calibrate the laser 121 using a method according to the present invention.

Furthermore, the receiving end 110 is arranged to feed back signals 113 to the transmitting end 120, via the above described optical fiber or a separate channel, which could be a separate optical fiber or any other communication link such as an electric wire. For example, in case the network 100 is a two-way communication network, such as a network for IP data traffic or a so-called fiber-to-the-home connection, the communication link from the receiving end 110 to the transmitting end 120 will already be present in the network 100. It is preferred that no such additional communication link is arranged, but to use an already existing, conventional one, for example the same fiber as used by the sender 120 to transmit light signals to the transmitter as described above, which fiber in this case carries signals in both directions.

In the conventional case, the required frequency of the tunable laser 121 will typically be known in advance. For example, if the receiving end 110 is a central node, it can communicate a specification of the desired frequency to the transmitting end 120. Alternatively, the frequency could be known in advance by way of network design. Then, the laser 121 would be calibrated to the specified frequency using some type of calibration table. As explained above, this would require a well defined laser temperature, extensive factory calibration of the transmitter unit and, in general, the use of a wavelength locker.

The method of the present invention can be used to calibrate any tunable semiconductor laser having at least one Bragg section. Various semiconductor laser types may incorporate different numbers and arrangements of Bragg sections. For example, the simple DBR (Distributed Bragg Reflector) laser features only one Bragg reflector, a phase section, a gain section and a cleaved facet reflector. The SG-DBR (Sampled Grating Distributed Bragg Reflector) and SSG-DBR (Super Structure Grating Distributed Bragg Grating) lasers are somewhat more complex, comprising an additional Bragg reflector with different periodicity and possibly a SOA (Semiconductor Optical Amplifier). The individually controllable Bragg reflectors admit the laser to be stepwise tunable across a broader spectrum. Another example of a widely tunable laser is the DS-DBR (Digital Supermode Distributed Bragg Reflector) laser, which features a multitude of Bragg sections.

Figure 2:
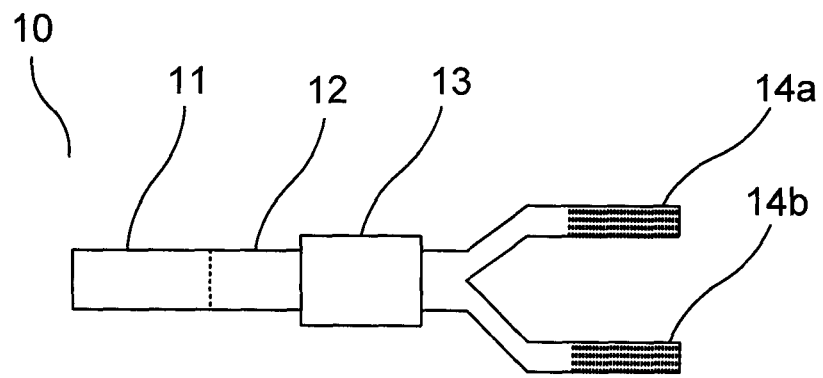
FIG. 2 is a simplified view of an MGY laser.

FIG. 2 illustrates an additional example of a semiconductor laser which is useful with the present method, namely an MGY-DBR (Modulated Grating Y-Branch Distributed Bragg Reflector) laser 10. It comprises an amplification section 11, a phase section 12, a coupler 13 and two Bragg reflector section branches 14a, 14b. Respective tuning currents are applied at least to the phase 12 and the reflector 14a, 14b sections.

According to the invention, the laser 121 is a tunable semiconductor laser of the above exemplified, general type, comprising at least a phase section and at least one or two Bragg reflector sections to which different currents can be applied in order to tune the laser 121.

Common to all such semiconductor lasers is the complex interplay between the Bragg section(s) and the phase section. In general, the Bragg current(s) need(s) to be selected in order to define the lasing wavelength. Also, the phase current needs to be selected in order for the optical length of the laser cavity to match this lasing wavelength, so that high-power, stable lasing can be achieved. To tune the laser, the Bragg and phase currents are then adjusted simultaneously to alter the lasing wavelength. The temperature dependence of the optical materials, together with ageing-induced changes, makes it a delicate task to calibrate the laser, and difficult to tune the laser to a certain absolute wavelength without using an absolute wavelength benchmark.

According to the invention, the laser 121 is not actively temperature stabilized, and preferably not actively cooled. Active temperature stabilization of the laser 121 would require extra equipment. Also, as explained above, as a consequence of not being actively cooled, the laser 121 does not have to be arranged in a hermetic package, resulting in a less expensive transmitter unit. The laser 121 is, however, equipped with a temperature sensor for monitoring its temperature, so that its frequency can be altered as a response to a relative shift in its operating temperature as described below.

It is also preferred that a conventional heater is arranged to heat the laser 121 during operation. Such heater can for example be one or several resistors, thermally coupled to the laser 121, in general not requiring hermetic packaging and being much cheaper than for example a peltier cooler.

Figure 3:
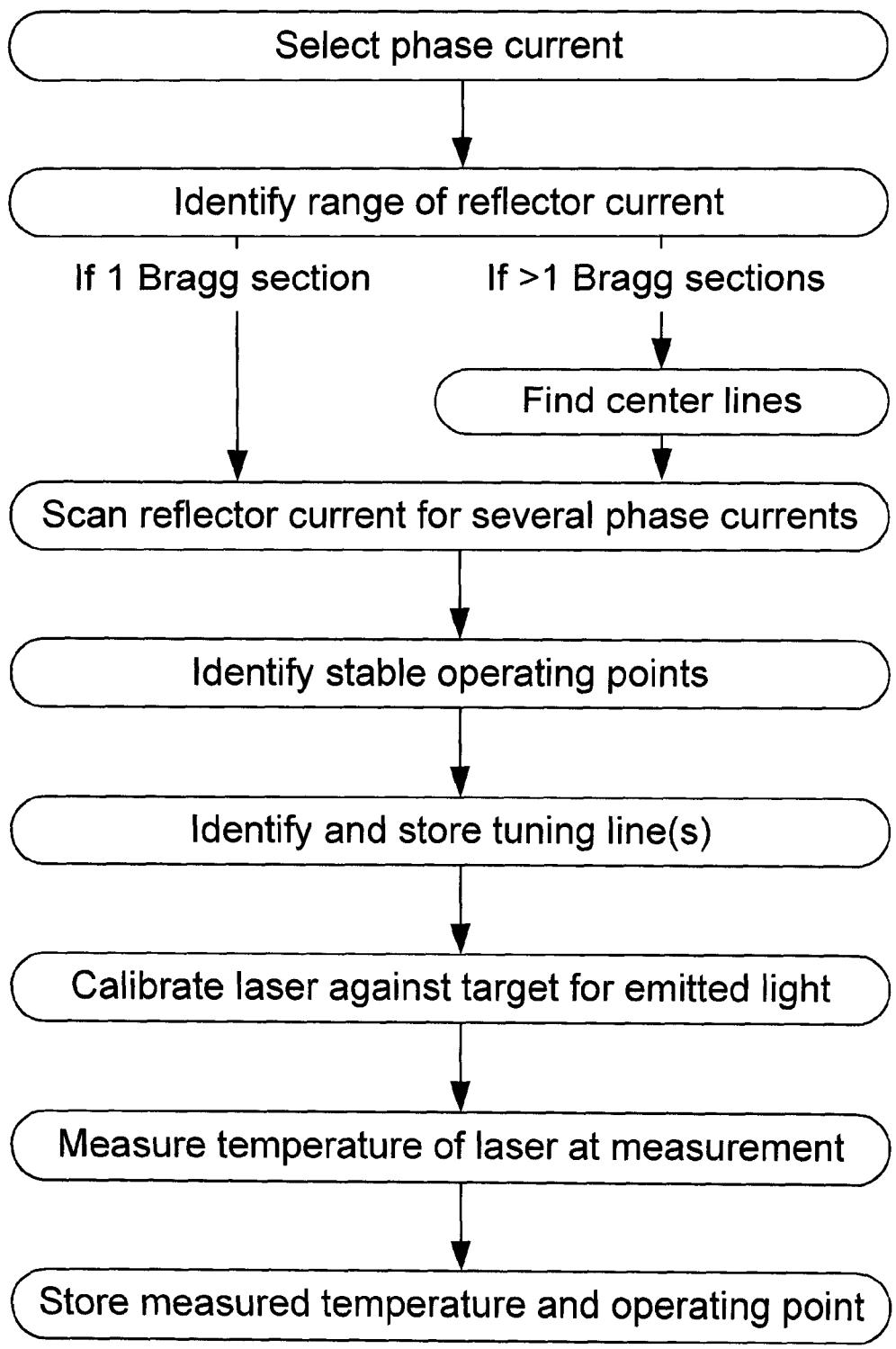
FIG. 3 is a flow diagram of a method according to the present invention.

As illustrated in FIG. 3, in a first step according to the present invention, at least one phase current is selected. Each or the phase current(s) selected may be any valid phase current.

Then, in a second step, for the at least one selected phase current a range of reflector currents are identified, which reflector currents in combination with the selected phase current achieve emission from the laser 121 of light within a desired frequency band of operation. It is preferred that said frequency band is within the above-described pass-band of the filter aggregate 130.

The range of reflector currents are preferably identified by performing a broad scan of the laser frequency of the tunable laser 121. In a DBR laser, this would for instance be accomplished by scanning the current applied to the single Bragg section. In an MGY-type laser or SG laser, a good way to achieve this would be by performing simultaneous scans of the currents applied to the two Bragg sections.

During the scan, the at least one selected phase current is applied. In case several phase currents are selected, it is preferred that a scan is performed for each selected phase current. During a scan with a certain phase current, mode jumps can cause the laser wavelength to shift rapidly, why certain possible wavelengths may not be achieved during the scan. Therefore, it is preferred to take into consideration the output wavelength from the several selected phase currents. Alternatively or additionally, it is preferred to dither the phase current during the scan to such extent that typical wavelength shifts due to the phase current dithering will be at least as large as typical wavelength shifts due to mode jumps. Using several parallel phase currents and/or phase current dithering, a scan pattern can be designed which will always deliver at least one lasing wavelength within the desired frequency band of operation. The usefulness of these options naturally depend on the specific laser design.

Figure 4:
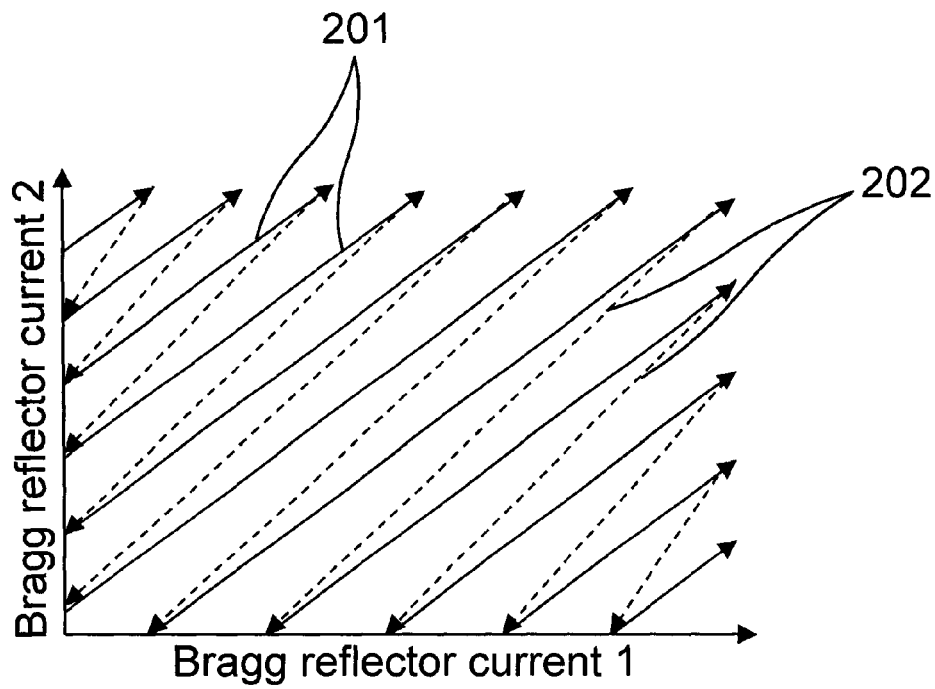
FIG. 4 is a graph illustrating a scanning pattern of the Bragg section currents of an MGY laser.

An exemplary scan pattern is illustrated in FIG. 4, wherein solid lines 201 indicate currents on and dashed lines 202 currents off. The x-axis represents the magnitude of one of the reflector currents, the y-axis that of the other. The distance between currents on scanning lines 201 should be substantially smaller than the typical super mode distance of the laser 121. It is preferred to use a nominal density of currents on lines 201 of at least 3 times the typical distance between two super mode jumps.

Figure 5:
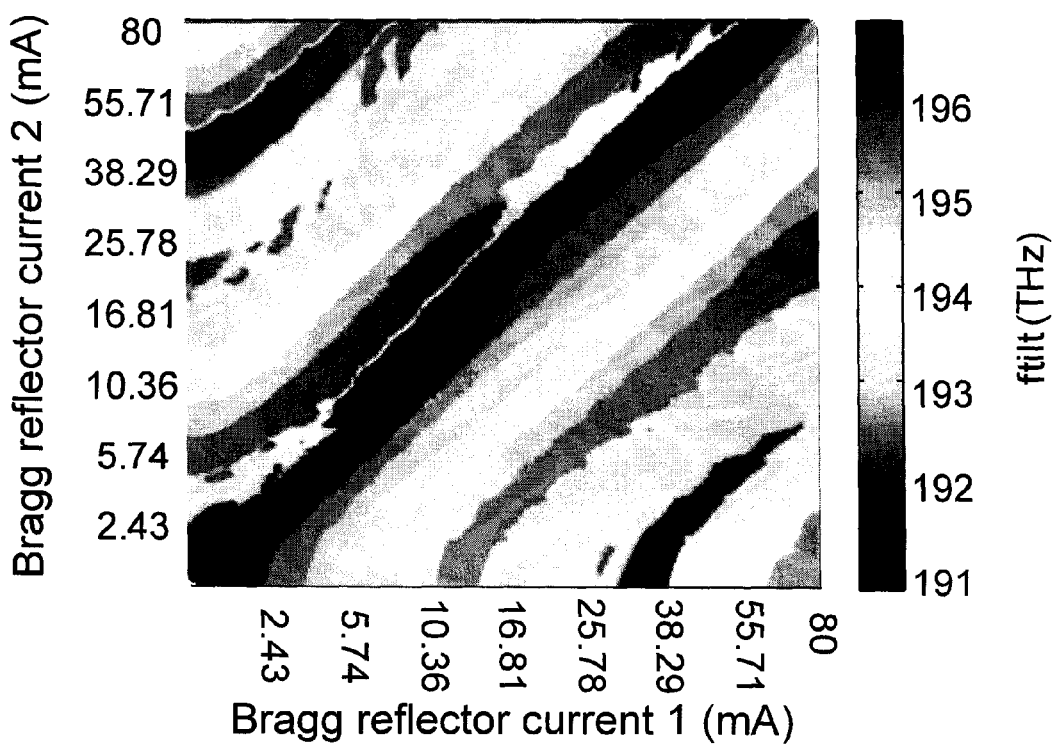
FIG. 5 is a graph illustrating the laser frequency for various reflector currents and a certain selected phase current for said MGY laser.

As is readily understood from FIG. 5, in which different frequencies are represented by different grey shades, and where the x- and y-axes measure the same Bragg reflector currents as in FIG. 4 but showing a broader current interval than FIG. 4, the lasing frequency is scanned across a broad frequency range during the broad scan illustrated in FIG. 4. By scanning along the solid diagonals 201 of increasing values in both reflector section currents, that is in the same direction, as shown in FIG. 4, it is possible to achieve relatively smooth frequency scans, possibly with some rapid local changes in wavelengths due to cavity mode jumps. The negative effects of such cavity mode jumps can, however, be overcome using for example phase current dithering as described above.

Note however that the laser 121 is not necessarily operating in a stable single mode with high side mode suppression ratio while performing the scan. This is because the Bragg peaks may not be perfectly aligned and because the optical length of the cavity will not be perfectly adjusted to the lasing wavelength.

At some point during the broad scan, the laser wavelength will coincide with the desired band of operation. In the case this band is within the above-mentioned aggregate filter passband, a signal will be detected at the receiving end 110. During the scan, the receiving end 110 will send signals informing the transmitting end 120 of the power level detected by the receiving end 110 at the moment, and the range of reflector currents are identified as those for which the receiving end 110 detects a light power which is larger than a certain predetermined threshold value. This way, the range of reflector currents will be identified as those reflector currents for which the emitted light falls within the target frequency range.

In case several phase currents were initially selected, and/or if phase current dithering was used, it is preferred to select for the continued method that phase current which was used in the combination of a phase current and one or several reflector currents which yielded the maximum transmitted power through the filter pass-band. According to one preferred embodiment, the single combination of one phase current and the or those reflector current(s) yielding the maximum transmission is selected as the starting point for the continued method.

Figure 6:
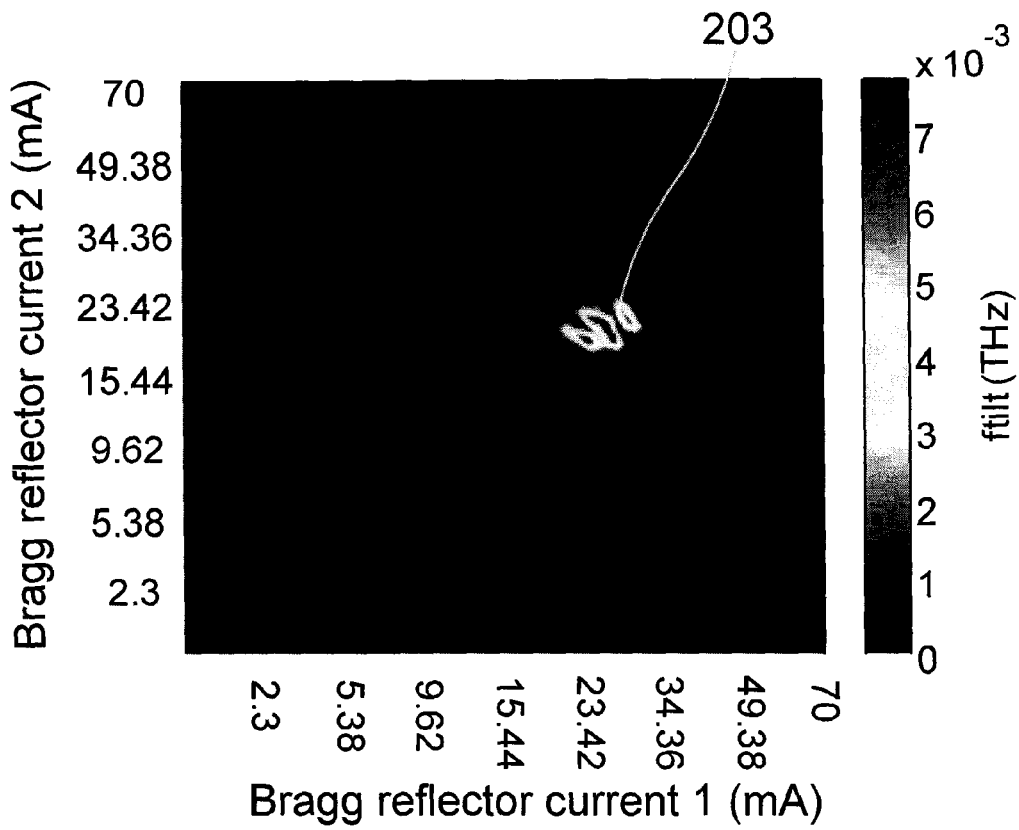
FIG. 6 is a graph illustrating the identified frequency band of operation for said MGY laser in an optical network.

FIG. 6, the x- and y-axes of which are similar to those of FIGS. 4 and 5, illustrates the range of reflector currents 203 that, together with a certain selected phase current yield laser emission from the transmitting end 120 within the detectable pass-band range and with a light power level above a predetermined threshold level. The identified reflector currents 203, together with the selected phase current, embody an initial, coarse laser 121 calibration.

In the case where the laser 121 comprises only one Bragg reflection section, the range of reflector currents scanned will thus comprise a one-dimensional range, being a subset of the possible values for the single reflector current applied through the single reflector section. In the case where the laser 121 comprises two Bragg reflector sections, the range of reflector currents will, similarly, comprise a two-dimensional range of the first and the second reflector currents, applied through the first and the second reflector sections, respectively.

Note that if the transmitting end 120 has obtained information about the required pass-band frequency range beforehand, or if the required pass-band frequency is established by design of the network 100, and if the laser 121 furthermore is capable of immediately being tuned into the vicinity of a certain frequency, the broad scan step can be limited to a localized area known from design characteristics of the laser 121. In this case, it is preferred that the scan area is increased iteratively and adaptively until a target throughput power is reached.

Note also that, in case there is no filter 130 in the network 100, the transmitting end 120 may simply assume that the interesting pass-band, that is the identified reflector currents, is the complete tuning range of the laser 121, and will immediately proceed from the first step to the third step, described below.

For laser types comprising several Bragg reflector sections, the next, third, step will be to find one or several center lines in the identified range of reflector currents for the certain selected phase currents. A "center line" is herein used to denote a set of reflector current value pairs, triples, etc. for which the corresponding Bragg reflection peaks of the respective reflector sections are aligned. In FIGS. 4-7, center lines hence extend diagonally in a southwest-northeast direction.

This third step, which is also shown in FIG. 3, will not be necessary if a laser with only one Bragg reflector section is used. This is for example the case with a DBR laser having only one Bragg section.

Figure 7:
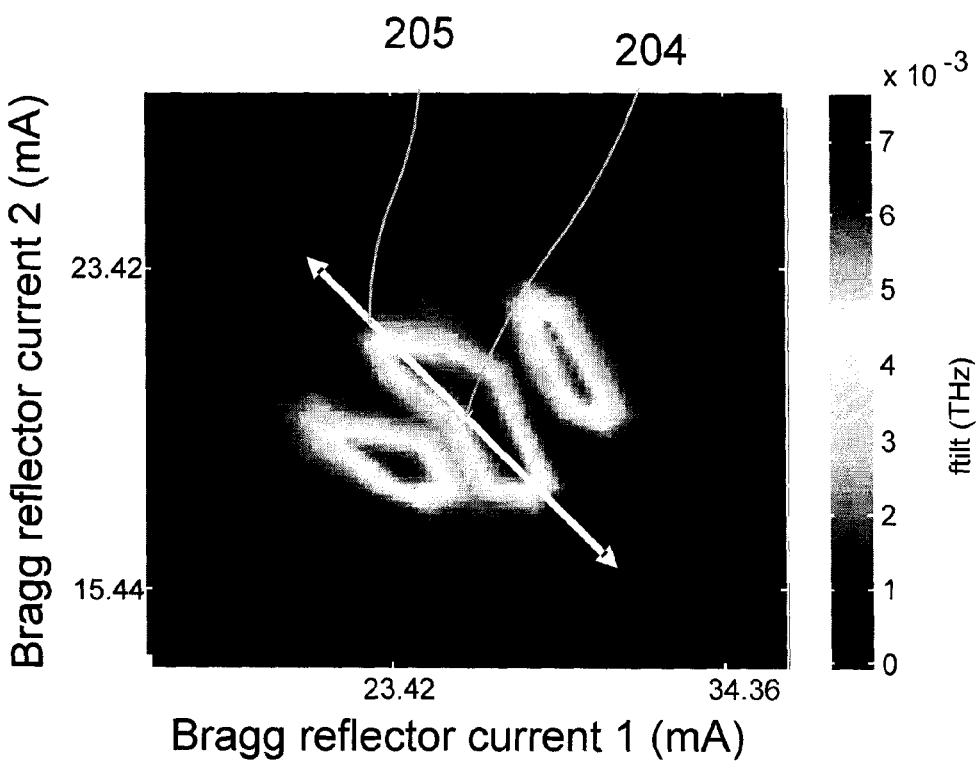
FIG. 7 is a graph illustrating a sweep across the band of operation shown in FIG. 6 for identifying a center line.

FIG. 7 illustrates schematically how a center line is detected in the identified range of reflector currents 203. FIG. 7 is a zoomed in version of FIG. 6.

In order to find the center line, at least one operating point 204 for which the Bragg peaks are aligned for the respective Bragg sections is identified by sweeping the reflector currents in a direction as indicated by double-ended arrow 205, in such a way so that the respective Bragg peaks of the Bragg sections are translated with respect to each other. The phase current used can be any valid phase current, but is preferably the same as the single one selected previously. It is preferred that the sweep is performed over the Bragg currents identified as yielding lasing within the desired frequency band of operation. Alternatively, the identified combination of Bragg currents yielding the above described maximum transmission is used as a starting point for the sweep.

In order to achieve the said translation, the reflector currents are swept along a line 205 which is not parallel to the center lines of the laser, preferably perpendicular to the center lines. During the sweep, the relative frequency output by the laser is detected, and said operating point along the center line is identified as one which is sufficiently distanced from areas of steep frequency slopes or discontinuities in the frequency output. According to one preferred embodiment, the operating point 204 is chosen as the midpoint between two adjacent detected frequency discontinuities. Such frequency discontinuities are in general indicative of mode jumps at mode boundaries, in this case super-mode jumps, and the midpoint will be sufficiently close to the actual point of perfect Bragg peak alignment.

Note that the absolute frequency does not have to be measured along the swept line 205, something which would require a frequency-calibrated detector. Instead, in order to find mode jumps, it is sufficient to detect a relative frequency change in the emitted laser light.

In practice and in a typical communications network 100, only one center line will be detectable within the range 203 of reflector currents in case said range has been identified using the existing filter aggregate 130 with its pass band. In the absence of a filter 130, or the filter 130 has a very wide pass band, several centerlines may however be present within the range 203. In such case, the relative frequency of the laser can for example be measured using two detectors, in a manner as described below, in order to identify several center lines. In the exemplary range 203 shown in FIGS. 6-7, only one center line is identified.

According to a preferred embodiment, only one combination 204 of the selected phase current and reflector currents located along the center line is found for each center line in the identified range 203 of reflector currents, and the complete center line is then calculated on the basis of beforehand design-based knowledge of the direction of extension of the center line in the plane shown in FIGS. 4-6.

One preferred way of measuring the relative frequency is that the signal fed back from the said target carries information about the light power passing through a frequency-dependent filter, and the relative frequency output is indirectly observed as a change in passed-through light power. In this case, it is also preferred that the target is a receiving end 110 such as the one of FIG. 1, and it is additionally preferred that the frequency-dependent filter is a filter assembly 130 as described above. Since the frequency of the laser 121 will vary coarsely during the sweep, especially when sweeping perpendicularly to the center line itself, the power detected by the detector 111 at the receiving end 110 will exhibit steep slopes in the vicinity of reflector current values where the laser performs a super-mode jump, since the new frequency will in practice be beyond the pass-band of the filter. If these steep slopes are taken as the mode boundaries, and if the midpoint between such steep slopes is taken as a point along a single center line in the identified reflector current range 203, center lines have proven to be properly detected in many applications.

Using this principle, a center line may be detected with no need for a frequency-calibrated detector or filter, by using already-existing equipment implying low installation cost.

Another preferred way of measuring the relative frequency for each point along the swept line 205 is to observe a signal fed back from a target for light emitted from the laser, which signal carries information about frequency, and measuring the relative frequency output as a change in fed back frequency. Such target may be arranged locally, in the same equipment as the laser, or remotely, at another network location. It is necessary for such target to be able to distinguish frequency shifts from fluctuations in light power, since the light power output from the laser may fluctuate substantially during the sweep.

For example, in certain applications it may be desirable not to use the receiving end 110 during the identification of center lines, but still not to have to rely on frequency-calibrated components. One example of such a case is when no filter is present between the transmitter 120 and the receiving end 110, or if the pass band of the filter 130 is so broad that several centerlines need to be identified. It may also be that it is desirable to use the receiving end 110 as little as possible during the calibration.

In such and other cases, it is preferred that the light emitted by the laser during the above described sweep is measured by both a first frequency-dependent light detector and a second frequency-dependent light detector. The detectors do not have to be calibrated to correctly measure an absolute frequency, however they must have different frequency responsivity. Using such detectors, the relative frequency output by the laser can be measured indirectly as the light power detected by the first light detector divided by the light power detected by the second light detector. Namely, since both detectors will receive identical laser light, a change in emitted light power, which in this case represents nothing more than signal noise, will not affect the calculated factor. On the other hand, a change in output frequency will affect the factor, and large relative frequency shifts can thus be caught with low risk of false alarms due to fluctuations in light power. Hence, such two detectors together form such a light intensity independent frequency detector as mentioned above.

In an especially preferred embodiment, the first and second light detectors are actually one and the same light detector. In this case, the detector is such that its frequency-dependency can be altered by changing a bias voltage applied to the detector. The light output by the laser is measured two times for each swept point, first using a first bias voltage and then using a second, different bias voltage. Finally, the factor is calculated as one of the measurement values divided by the other.

In case one or two frequency-dependent light detectors are used to calculate the factor, it is preferred that they are part of the same package as the laser 121, more preferable that they constitute already existing monolithically integrated section (s) of the semiconductor laser 121 that are reverse biased to act as photo detectors. Preferably, they are built up from different materials. For example, in an MGY-SOA laser, the semiconductor optical amplifier section (SOA), consisting of active gain material, and a section comprising tuning material, such as the integrated front reflector (IFR), can be used. In case the two detectors are built up from the same optical material, different frequency response can be achieved by biasing the sections differently in order to achieve different frequency responses, as explained previously.

Once the coarse calibration has been accomplished, by scanning the reflector currents as described above, and once at least one center line 204 has been identified where applicable, a fourth step is performed as shown in FIG. 3, involving scanning the reflector currents over at least the range 203 of reflector currents as identified in the second step, for at least two different phase currents and advantageously for increasing phase current values. Preferably, the reflector currents are scanned over a plurality of discreet phase currents, most preferably covering essentially the whole available range of phase currents of the laser.

For each such phase current, the relative output power of the laser is read for each point scanned, using a conventional power monitor, for example an external photo detector or a monolithically integrated photo detector, or a SOA used as a photo detector.

For a laser with only one Bragg reflector section, the single reflector current will be scanned, for each phase current, across at least the range identified in the second step as described above. For a laser with two Bragg reflector sections, it is preferred to scan both the first and second reflector currents simultaneously and in parallel along a line along which the Bragg peaks of the respective Bragg sections are aligned and not translated in relation to each other during the scan. In other words, the scan takes place along a center line as identified in step three as described above. If several center lines have been identified, the procedure is preferably repeated for each of these.

Subsequently, in a fifth step as shown in FIG. 3, at least one stable operating point is identified for each one of the phase currents used for the scan performed in the fourth step. A "stable operating point" is herein used to describe a combination of phase and reflector currents among those scanned in the fourth step as described above, and at which combination the laser lases with stable frequency, high power and high side mode suppression. According to one preferred embodiment, the criteria for choosing such stable points are worked out for each specific type of semiconductor laser based upon measurement experience. Preferably, stable operating points are chosen as ones located sufficiently far from mode boundaries resulting in rapid shifts in the emitted laser light power.

According to an especially preferred embodiment, each stable operating point is selected as one which is located along a scan trajectory between two adjacent mode boundaries in the relative laser output power, sufficiently far from each such boundary, and for which any occurring hysteresis is minimal. The selection of a stable operating point is performed based upon knowledge of the specific laser design and experience regarding environmental changes and aging of the laser. See Swedish patent application no 0800656-1 for an example of how a stable operating point may be selected along a center line. In order to measure hysteresis, it is preferred to scan the reflector current(s) twice, first in one direction and then in the opposite direction along the same path, then to compare the power values for the different measurements and finally calculate the hysteresis based upon these power values.

It is known that the laser power correlates with the frequency and the side mode suppression ration (SMSR), as explained for example in U.S. Pat. No. 6,658,033. Thus, stable lasing operating points with stable frequencies and good SMSR will in general render stable and relatively high laser output power.

Figure 8:
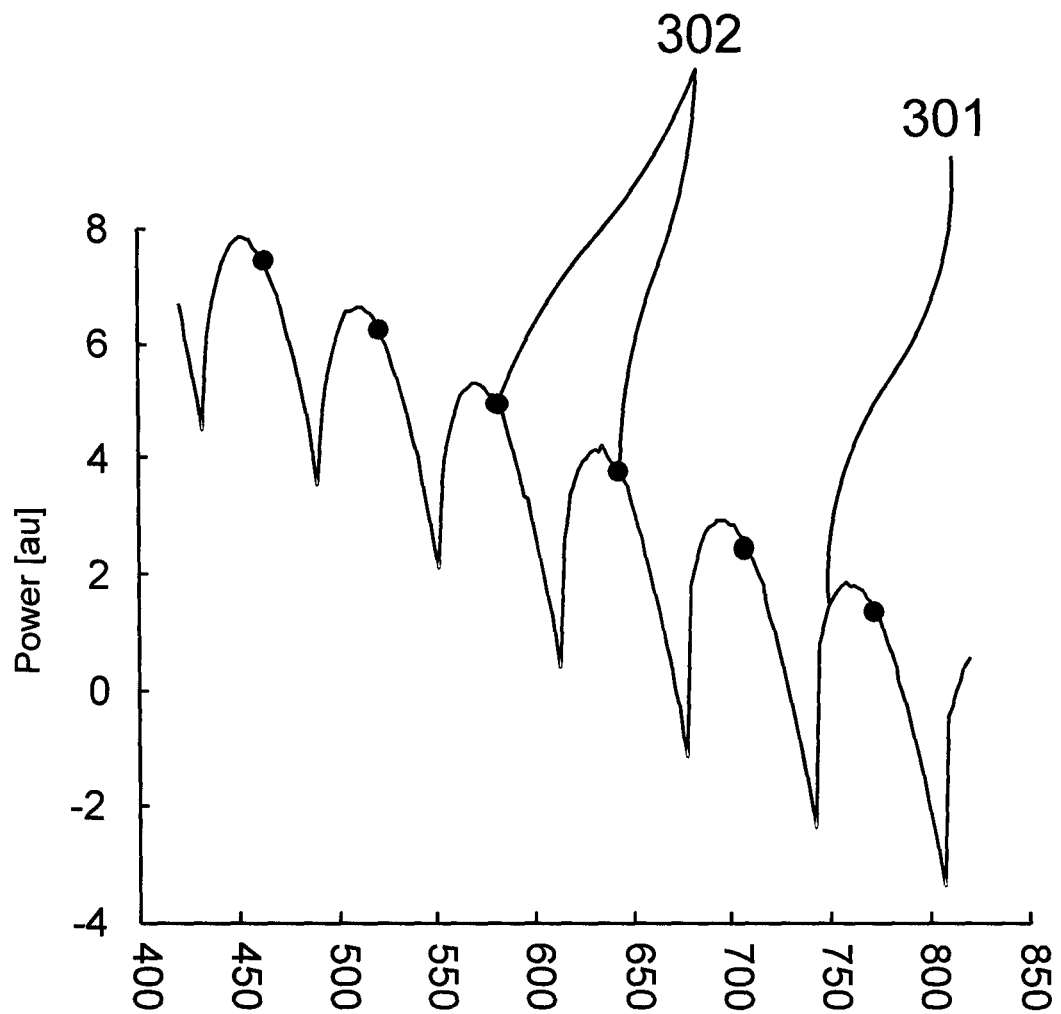
FIG. 8 is a graph illustrating the identification of stable operating points for a certain phase current.

FIG. 8 illustrates an example of such a measured power curve 301, for a certain phase current and along an identified center line of an MGY-SOA laser. On the horizontal axis of the graph, the two Bragg section currents are measured. Along the identified center line, the ratio between the first and the second reflector section current is constant, and in line therewith the horizontal axis has been normalized as $$f = f_{10}\log\left(\frac{I_{DBR1}}{I_{10}} + 1\right) + f_{20}\log\left(\frac{I_{DBR2}}{I_{20}} + 1\right).$$

Along the vertical axis, the measured power is depicted. Identified stable operating points 301 are shown using solid dots.

Figure 9:
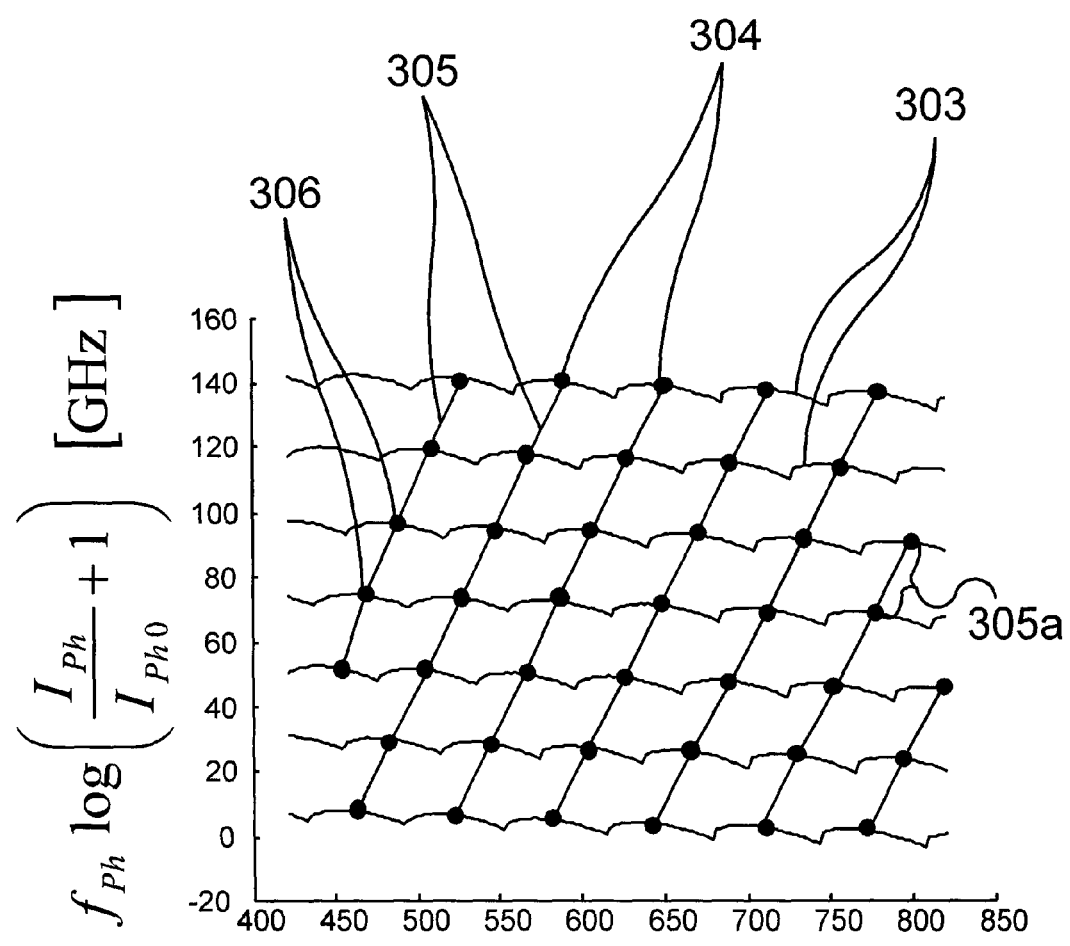
FIG. 9 is a graph illustrating the identification of stable operating points for a number of consecutive phase currents, which figure also shows tuning lines.

The graph shown in FIG. 9 is similar to that shown in FIG. 8, but shows power measurement curves 303 for consecutive phase currents.

The horizontal scale of FIG. 9 is similar to that of FIG. 8, but the vertical scale of FIG. 9 measures both the phase current and the output power of the laser are measured. Thus, the vertical axis comprises two different scales. For each curved line 303 shown in the graph, the general position of the line along the vertical axis reflects the phase current used for the scan represented by the line in question. Since the absolute value of the power is not interesting for the present purposes, but rather the shape of the trace, the different lines 303 have been shifted vertically in relation to each other by an amount corresponding to their respective phase current value. The vertical variations of each line 303, on the other hand, represents variations in the output power of the laser as the reflector currents are varied along the horizontal axis. The vertical axis representing the phase current is normalized according to $$f = f_{ph}\log\left(\frac{I_{ph}}{I_{ph0}} + 1\right).$$

The normalizations of the horizontal and vertical axes are useful since the lasing frequency is proportional to both the reflector currents and the phase current. After normalization, both axes have the convenient units of GHz, so that one can directly read the nominal relative frequency shift from the graph.

In FIG. 9, for each phase current scanned, all stable operating points 304 have been identified. They are depicted in the graph as solid dots.

In a sixth step, as shown in FIG. 3, at least one continuous tuning line 305 is constructed by interpolating between a neighboring pair or neighboring pairs 306 of the stable operating points 304 identified in the fifth step. Such neighboring pairs 306 of stable operating points 304 have consecutive phase currents as viewed in FIG. 7. Which specific identified stable operating points that are to be combined to mutually form a tuning line is readily resolved by using design specific frequency shifts for the phase current and reflector currents, respectively.

Thus, each tuning line 305 is constructed so that when the laser is tuned along the tuning line, the phase current is continuously adjusted and each reflector section current is adjusted accordingly to follow the tuning line. Each tuning line 305 is stored into a memory, such as a lookup table, so that the laser can be tuned along the tuning line at a later point in time. The memory can be any conventional on-chip or external memory, preferably a digital memory.

It is preferred that each tuning line segment 305a between two neighboring stable operating points is an interpolation in the above-defined frequency domain, preferably a straight line in said frequency domain. This way, the necessary calculations are kept simple, which is preferred. The total length of each tuning line 305 will depend on constrains put on the tuning currents in the actual application.

Now, any operating point along such a tuning line 305 will also be a stable operating point. A key insight lying behind the current invention is that the stability of such operating point, as defined in current units, is approximately independent of the temperature of the laser. This is because the identified tuning lines 303 reflect the detuning of the cavity mode relative the Bragg peaks. To first approximation both quantities will shift by the same amount as a function of temperature. This is the case for all semiconductor lasers of the types discussed above.

In practice there will, depending on the type and design of the laser, be a slight dependency of the correct location of the tuning lines 305 as a function of the temperature of the laser. However, this dependency can in general be characterized and quantified using conventional methods. For example, the position of the tuning lines can be detected for a range of different laser temperatures and for a certain type of laser. Such characterization will only be necessary to perform once for each laser type, since the shift of the tuning lines is systematic and consistent for a certain laser type. Hence, the temperature dependency can then be compensated for during tuning of the laser. Consequently, the tuning lines 305 identified as described above can be validly used also at other laser temperatures then the one used during calibration.

Moreover, the actual laser frequency at a certain stable operating point along a certain tuning line 305 will depend on the laser temperature, the dependency being quantifiable beforehand and typically around −12 to −14 GHz/° C.

To summarize, the thus far described method will result in a set of stored tuning lines 305 along which the laser frequency can be monotonically and continuously, or quasi-continuously scanned, by moving from one tuning line to the next when reaching the end of said first tuning line, always at stable frequencies. The tuning lines 305 along which the frequency scanning is to be conducted will be almost independent of the actual laser temperature during the scan, however only the relative frequency change can be determined beforehand—the absolute frequency at each point along the tuning line 305 will be unknown.

In order to obtain a complete calibration of the laser 121, according to the invention and in a seventh step as shown in FIG. 3, the laser is scanned along each identified tuning line 305, and the light emitted is transmitted to the same target for emitted light described above, or to another such target for emitted laser light, which target communicates to the transmitting end 120 a feedback signal carrying information about whether the light emitted by the laser 121 is within a certain target frequency range.

Preferably, the feedback signal also comprises information about the absolute detectable frequency interval, for example in the form of the channel number of the network, or the channel number according to some specific standard, so that the transmitting end 120 can derive the exact absolute frequency limits for which the target can detect the emitted light. This way, the transmitter can deduce the absolute frequency at which it emits light when tuned to a certain point along a certain tuning line 305.

In the preferred case where the target is the receiving end 110, being able to detect emitted light across frequencies within the pass-band of the filter aggregate 130, it may not be necessary for the transmitting end 120 to be aware of the absolute frequency value at which it should emit light, since it would suffice to know the point along the tuning line 305 to use at a certain laser temperature, see below.

Figure 10:
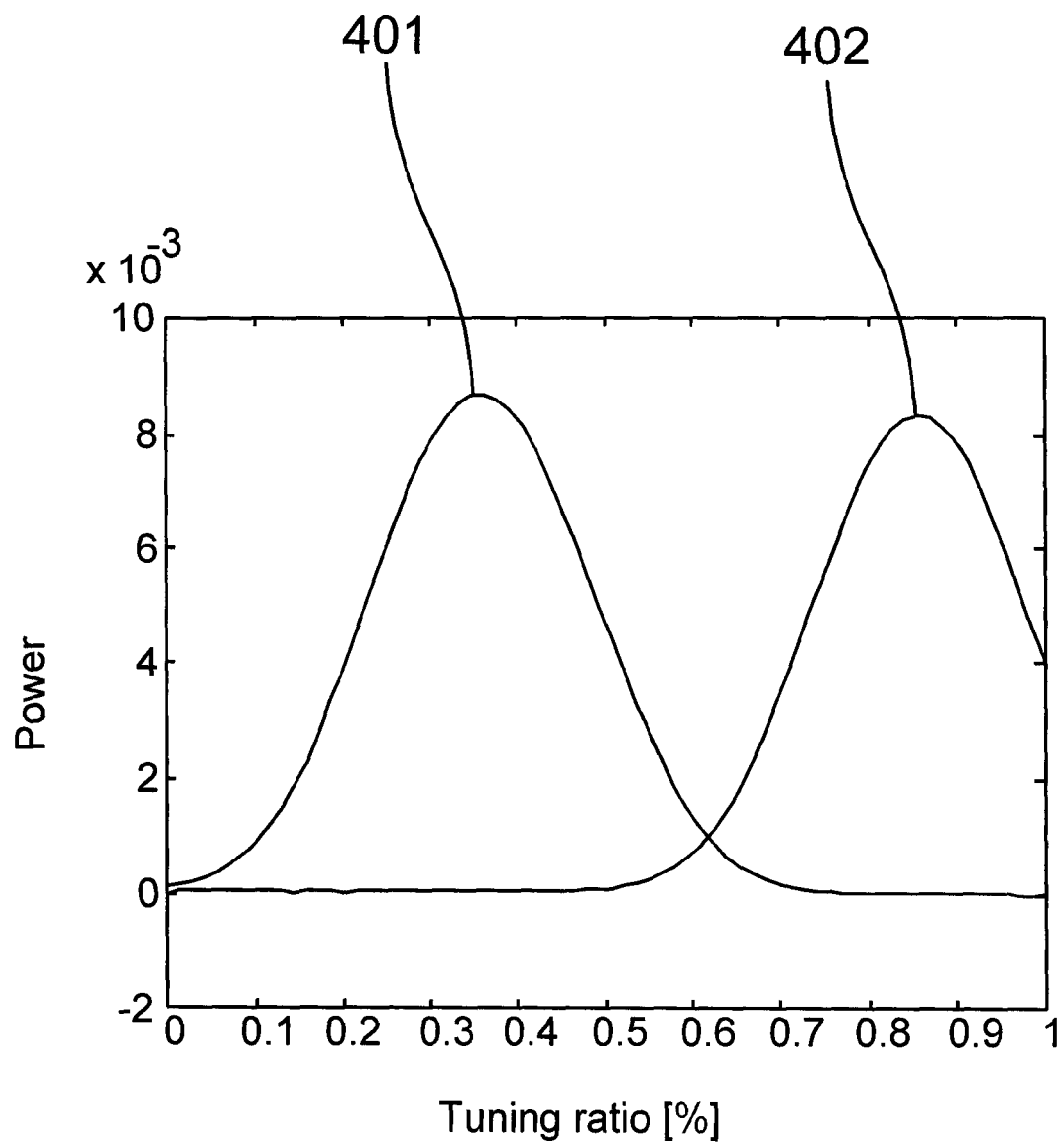
FIG. 10 is a graph illustrating the detected light during a final calibration step according to the present invention.

FIG. 10 illustrates the detection response 401, 402 from the detector 111 in the receiving end 110 during the calibration scan along two different tuning lines. The x-axis depicts the position along the tuning line, and the y-axis depicts the measured power. As is clear from the graph, there will be a certain frequency overlap between any two tuning lines. However, the respective combination of tuning currents along two different tuning lines yielding the same laser output frequency will be different.

In an eighth step, as shown in FIG. 3, the temperature of the laser 121 is measured at the time when the measurement of the seventh step was conducted.

In a subsequent ninth step, the temperature of the laser 121 and, for each tuning line 303, at least one operating point along said tuning line which is characteristic of the target frequency range, is stored in the above described memory or another, similar memory. This stored value is then used as frequency reference during subsequent tuning of the laser.

As an example, one or both of the operating points along the tuning line corresponding to the target frequency range end-points, in other words at least one of the entry and the exit points of the allowable interval during the scan along each tuning line 305, is stored in the memory. Alternatively, at least the midpoint in the allowable interval, or the operating point yielding the maximum response in the target for emitted light, in the case of the network 100 of FIG. 1 the peak for the filter 130 pass-band, is stored.

During operation, the temperature of the laser may depart from that prevailing during the calibration. Hence, the specific stable operating point along a certain tuning line which was found to be the most efficient during the final calibration done in the above seventh step may no longer be the most efficient one at the new operating temperature.

However, since the laser frequency depends on the temperature of the laser in a known way, it is possible to compensate for a temperature induced frequency shift by tuning the laser along the identified tuning lines 305 so that the temperature induced frequency shift is counteracted. It is preferred to investigate, before the operation of a particular laser begins, the exact dependency between temperature and frequency for the specific type or category of laser to which the laser belongs, by routine experimentation. Alternatively, if detailed information on the output frequency of the laser is available in the network 100 during operation, it is preferred to use this information instead.

Figure 11:
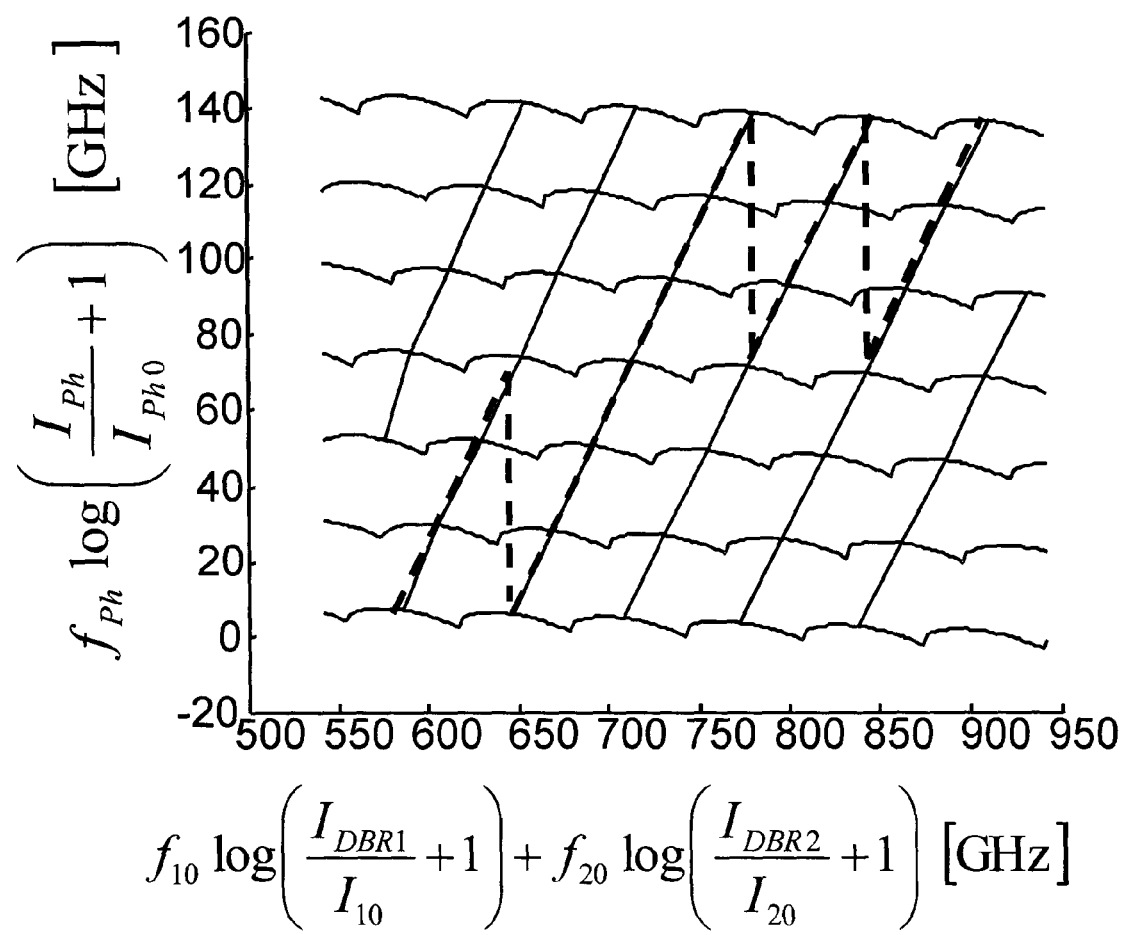
FIG. 11 is a graph similar to the one in FIG. 9, but also showing a representative tuning trajectory.

By tuning the operating point of the laser along a tuning line 305, stable lasing is achieved with a predictable frequency shift in comparison to the calibrated base point. When reaching the limit of a tuning line, the tuning is continued along a neighboring tuning line and so forth. The result is a saw-tooth trace an example of which is shown in FIG. 11, showing a graph similar to the one shown in FIG. 10. Using this technique, stable, precise tuning across a large part of the complete tunable range of a laser can be accomplished.

Returning to FIG. 9, one can see that the tuning lines 305 together cover approximately almost 350 GHz, which is to first approximation sufficient to compensate for 23° C. of laser temperature change. Compared to a temperature-stabilized laser, which is usually held at a constant temperature of about ±0.1° C., this is a very broad temperature interval across which reliable tuning is possible. As mentioned above, the position of the tuning lines 305 is to first approximation independent of the laser temperature. In practice, there will be a certain dependence, and in order to keep accuracy it is therefore possible and sometimes desirable to only operate the laser using the identified set of tuning lines 305 when within a certain predetermined temperature interval.

Thus, according to a preferred embodiment the temperature of the laser is continuously or intermittently measured during operation, and the operating point of the laser is updated along the identified tuning lines 305 in response to and correcting for changing laser temperatures, across a temperature range spanning across at least 5° C., more preferably at least 10° C., most preferably at least 20° C.

In order to achieve precise tuning operation across a broader temperature interval, the laser is, according to one preferred embodiment, preheated to a certain temperature above ambient temperature in an initial step before the first step as shown in FIG. 3. Then, the laser is kept within a temperature range comprising this elevated temperature during operation by aid of additional heating. Such additional heating can, for example be performed using a resistor as described above for keeping the laser at an elevated, approximately constant temperature. It is preferred that the preheat temperature is chosen to be so high so that the laser will never reach a higher temperature on its own during normal operation. This way, the same set of identified tuning lines 305 can be used continuously with no need for recalibration.

Alternatively, the laser is operated under temperature surveillance as described above, and recalibrated in case the temperature falls outside of the said temperature interval. Hence, in this case a new set of tuning lines are identified using the above algorithm. In this case, a new temperature range of the above size is established in relation to the new calibration. This way, the laser 121 can be started quickly, and since a calibration could be accomplished relatively quickly, the downtime when switching temperature ranges will in many applications be fully acceptable, in many cases as short as a few seconds or less.

According to one preferred embodiment, recalibration is also performed routinely at certain intervals of longer duration, such as monthly or yearly. This way, age-induced drifts etc. can be accounted for in the updated tuning lines.

If uptime is more critical than boot time, the laser may in an initial step be heated so as to assume a number of different consecutive temperatures, each comprised in a respective one of a consecutive series of temperature ranges of the above described size. When assuming each such consecutive temperature, the laser is calibrated, and the resulting tuning lines for each such calibration is stored into the same memory as mentioned above or another similar memory. Then, during operation, the tuning lines stored associated with the temperature range in which the current operating temperature of the laser is comprised are used to set the output frequency of the laser. It is preferred that the temperature in said initial step is increased by between 15° C. and 20° C. between each measurement.

Above, preferred embodiments have been described. However, it is apparent to the skilled person that numerous modifications can be imparted to the described embodiments.

For example, a semiconductor laser having three or more Bragg reflector sections can be calibrated using the corresponding methodology as described above. When extracting the center line or center lines for such a laser, it is necessary to sweep the reflector currents in a multidimensional (at least three-dimensional) space. In order to increase the speed of the method, in this case it is preferred to exploit known information relating to the design of such laser when selecting sweep trajectories that maximize the chances of quickly finding center lines. Such strategies are analogue to the one described above for a two-dimensional sweep, according to which the sweep direction is perpendicular to the expected direction of center line extension, and are within the knowledge of the skilled person.

Thus, the invention is not limited to the described embodiments, but can be varied within the scope of the enclosed claims.

The invention claimed is:

1. Method for calibrating a tunable semiconductor laser (121;10) comprising at least a phase section (12) and at least a first Bragg reflector section (14a,14b), through which sections a phase current and a first reflector current, respectively, is applied, which laser (121;10) is not actively temperature stabilized, said method comprising the steps of
    a) selecting at least one phase current;
    b) identifying for one particular phase current, selected among the phase current or currents selected in step a), a range (203) of reflector currents that in combination with the particular phase current achieves emission of light from the laser (121;10) within a desired frequency band of operation for the laser (121;10);
    c) scanning the reflector current or currents over at least the range (203) of reflector currents as identified in step b), for each of at least two different phase currents, and reading the relative output power of the laser (121;10) for each point scanned;
    d) identifying, for each phase current as used in step c), at least one stable operating point (302) as that or those points scanned in step c) which are located between two adjacent mode boundaries, as detected as steep shifts in the relative laser output power, and possibly for which any hysteresis is minimal;
    e) identifying and storing into a memory at least one stable, continuous tuning line (305) as constructed by interpolating between neighboring stable operating points (302), as identified in step d), of different phase currents;
    f) calibrating the laser frequency by scanning along said identified tuning line (305) and observing a fed back signal (113) from a target (110) for the light emitted from the laser (121;10), which signal (113) carries information about whether the light emitted by the laser (121; 10) is within a certain target frequency range;
    g) measuring the temperature of the laser (121;10) when step f) was conducted; and
    h) storing into the memory the temperature of the laser (121;10) and at least one operating point along the tuning line (305) indicative of the target frequency range.

2. Method according to claim 1, wherein the laser (121;10) furthermore comprises a second Bragg reflector section (14a, 14b) through which a second reflector current is applied, where in step b) the range of reflector currents comprises a two-dimensional range (203) of the first and the second reflector currents, and wherein the scanning of the reflector current in step c) involves scanning both the first and second reflector currents simultaneously and in parallel along a line (205) along which the Bragg peaks of the respective Bragg sections (14a,14b) are aligned and not translated in relation to each other during the scan.

3. Method according to claim 2, wherein in an additional step, after step b) but before step c), at least one operating point for which the Bragg peaks are aligned for the respective Bragg sections is identified by sweeping, for a certain phase current, the reflector currents in such a way that the respective Bragg peaks of the Bragg sections are translated with respect to each other, measuring the relative frequency output by the laser (121;10) during the sweep, and identifying said operating point as one which is distanced from mode boundaries resulting in rapid shifts in the frequency output.

4. Method according to claim 3, wherein the relative frequency output by the laser (121;10) is measured by observing a signal (113) fed back from a target (110) for light emitted from the laser (121;10), which signal (113) carries information about the light power passing through a frequency-dependent filter (113) and observing the relative frequency output indirectly as a change in passed-through light power.

5. Method according to claim 3, wherein the light emitted by the laser (121;10) is measured by a first frequency-dependent light detector and a second frequency-dependent light detector, which first and second detectors have different frequency responsivity, and wherein the relative frequency output by the laser (121;10) is measured indirectly as the light power detected by the first light detector divided by the light power detected by the second light detector.

6. Method according to claim 5, wherein the first and second light detectors are one and the same light detector the frequency-dependency of which can be altered by changing a bias voltage applied across the light detector, but wherein the light output by the laser (121;10) is first measured by the light detector using a first bias voltage and then by the light detector using a second, different bias voltage.

7. Method according to claim 5, wherein at least one frequency-dependent light detector is a reverse biased section of the semiconductor laser (121;10) acting as a photo detector.

8. Method according to claim 5, wherein at least one frequency-dependent light detector is a monolithically integrated part of the semiconductor laser (121;10).

9. Method according to claim 1, wherein in step b) the signal fed back from the target (110) for emitted light is observed, and the range (203) of reflector currents is identified as those reflector currents for which the emitted light falls within the target frequency range.

10. Method according to claim 1, wherein in step d) the reflector current is scanned in a first direction and then along the same path but in the opposite direction, and wherein the hysteresis of each such scanned operating point is calculated based upon a comparison of the laser light power values for the different measurements.

11. Method according to claim 1, wherein the temperature of the laser (121;10) is measured during operation, and wherein the current operating point of the laser (121;10) is updated along the identified tuning lines (305) in response to changing laser temperatures so as to compensate for the change in lasing frequency imparted by the temperature shift, and wherein the same identified tuning line or lines (305) are used across a temperature range spanning across at least 5° C.

12. Method according to claim 11, wherein the laser (121;10) is preheated to a certain temperature above ambient temperature, and is kept within a temperature range comprising the said elevated temperature and spanning across at least 5° C. during operation by additional heating.

13. Method according to claim 11, wherein the laser (121;10) is recalibrated in case the temperature falls outside of the said temperature interval, and that a new temperature range is then established in relation to this new calibration of the laser (121;10).

14. Method according to claim 11, wherein the laser (121;10) in an initial step is heated so as to assume a number of different consecutive temperatures, wherein the laser (121;10) is calibrated at each of said consecutive temperatures, wherein the resulting tuning lines (305) for each such calibration are stored into a memory, and wherein during operation the tuning lines (305) stored associated with the current operation temperature of the laser (121;10) are used to set the output frequency of the laser (121;10).

15. Method according to claim 1, wherein the target (110) for the light emitted from the laser (121;10) comprises a conventional light detector (111) and wherein at least one conventional optical filter (130) is present between the laser (121;10) and the detector (111), both constituting existing components of an optical communications network (100) in which the laser (121;10) is also a part.

16. Method according to claim 1, wherein the laser is not actively cooled.

* * * * *